(12) United States Patent
Trenz et al.

(10) Patent No.: US 12,273,047 B2
(45) Date of Patent: Apr. 8, 2025

(54) INVERTER WITH OPTIMIZED ELECTROMAGNETIC PERFORMANCE

(71) Applicant: ZF Friedrichshafen AG, Friedrichshafen, DE (US)

(72) Inventors: Ivonne Trenz, Friedrichshafen (DE); Michael Kohr, Bodnegg (DE); Florian Pahn, Ravensburg (DE); Pengshuai Wang, Eriskirch (DE); Manuel Raimann, Salem (DE); Philipp Rau, Friedrichshafen (DE); Jonas Zeller, Friedrichshafen (DE); Gerhard Müller, Immenstaad am Bodensee (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 372 days.

(21) Appl. No.: 17/957,608

(22) Filed: Sep. 30, 2022

(65) Prior Publication Data

US 2023/0098335 A1 Mar. 30, 2023

(30) Foreign Application Priority Data

Sep. 30, 2021 (DE) .................... 10 2021 210 938.1

(51) Int. Cl.
*H02M 7/5387* (2007.01)
*B60K 1/00* (2006.01)
(Continued)

(52) U.S. Cl.
CPC ............ *H02M 7/5387* (2013.01); *B60K 1/00* (2013.01); *H02M 1/44* (2013.01); *H02M 7/003* (2013.01); *B60K 2001/001* (2013.01)

(58) Field of Classification Search
CPC ...... H02M 7/5387; H02M 7/003; B60K 1/00; B60K 2001/001
See application file for complete search history.

(56) References Cited

U.S. PATENT DOCUMENTS

| 11,254,223 B2 * | 2/2022 | Hao ..................... H02M 3/1582 |
| 2011/0011658 A1 * | 1/2011 | Takizawa ................ B60L 58/18 318/139 |

(Continued)

FOREIGN PATENT DOCUMENTS

| DE | 10 2012 201 752 A1 | 8/2013 |
| DE | 10 2012 201 754 A1 | 8/2013 |

(Continued)

OTHER PUBLICATIONS

Office Action in German Application No. 10 2021 210 938.1, dated Jun. 2, 2022, (12 pages).

*Primary Examiner* — Brian L Swenson
(74) *Attorney, Agent, or Firm* — Crowell & Moring LLP

(57) ABSTRACT

An inverter includes a DC input, a link capacitor including a plurality of input contacts fitted to a capacitor housing, a plurality of half-bridges, each including semiconductor switching elements for converting the DC current into an AC current having a plurality of phase currents, wherein the half-bridges are arranged in a row along a transverse direction to the inverter, a positive DC conductor rail and a negative DC conductor rail for the infeed of DC current to the half-bridges, wherein the positive and/or negative DC conductor rail extends in a transverse direction to the inverter over the row of half-bridges, such that the width of the positive and/or negative DC conductor rail extends to the width of the row of half-bridges, an AC conductor rail assembly for the output of AC current to the electric drive, and a cooler for cooling the half-bridges.

12 Claims, 5 Drawing Sheets

(51) Int. Cl.
*H02M 1/44* (2007.01)
*H02M 7/00* (2006.01)

(56) References Cited

U.S. PATENT DOCUMENTS

| | | | |
|---|---|---|---|
| 2013/0314948 A1* | 11/2013 | Perreault | H02M 7/497 363/8 |
| 2019/0123659 A1 | 4/2019 | Okubo et al. | |
| 2019/0296638 A1* | 9/2019 | Nakashima | H02M 7/537 |
| 2021/0135598 A1* | 5/2021 | Nakashima | H02M 7/53871 |

FOREIGN PATENT DOCUMENTS

| | | |
|---|---|---|
| DE | 10 2014 208 594 A1 | 11/2015 |
| DE | 10 2017 215 729 A1 | 3/2019 |
| DE | 10 2019 213 857 A1 | 3/2021 |
| DE | 10 2019 220 010 A1 | 6/2021 |
| JP | 2010-183 748 A | 8/2019 |

* cited by examiner

INVERTER WITH OPTIMIZED ELECTROMAGNETIC PERFORMANCE

CROSS-REFERENCE TO RELATED APPLICATION

This application claims priority to German Patent Application No. 102021210938.1, filed on Sep. 30, 2021, the entirety of which is hereby fully incorporated by reference herein.

BACKGROUND AND SUMMARY

The present disclosure relates to an inverter for energizing an electric drive of an electric vehicle or a hybrid vehicle, and to a corresponding vehicle having such an inverter.

Purely electric vehicles and hybrid vehicles are known from the prior art, which are propelled, either exclusively or in a supported manner, by drive units in the form of one or more electrical machines. In order to supply the electrical machines of such electric vehicles or hybrid vehicles with electrical energy, electric vehicles and hybrid vehicles comprise electrical energy stores, particularly rechargeable electric batteries. These batteries are configured as DC voltage sources, whereas electrical machines, however, generally require an AC voltage. Consequently, power electronics, incorporating an "inverter", are customarily arranged in-circuit between a battery and an electrical machine of an electric vehicle or a hybrid vehicle.

Such inverters customarily comprise semiconductor switching elements, which are typically formed of transistors. It is known for semiconductor switching elements to be provided with different levels of integration, namely, either in the form of discrete individual switches with a low integration level, but with a high degree of scalability, in the form of power modules with a high integration level, but with limited scalability, or in the form of half-bridges which, with respect to their integration level and scalability, range between individual switches and half-bridges or power electronics modules.

Known inverters from the prior art feature a high design-related stray inductance. As this stray inductance links to the operating speed of semiconductor switching elements, and thus generates voltage overshoots, the functionality of known inverters is impaired accordingly. Moreover, heat generated during the operation of the inverter can only be evacuated to an inadequate extent, thus impairing the functionality of the inverter.

One object of the present disclosure is the provision of an inverter which at least partially eliminates the above-mentioned disadvantages.

This object is fulfilled by the inverter and the vehicle according to the present disclosure. Advantageous configurations and further developments of the invention are also disclosed.

The present disclosure relates to an inverter for operating an electric axle drive of an electric vehicle and/or of a hybrid vehicle. The inverter comprises a DC input for the connection of a DC voltage source. The DC voltage source is, for example, a battery, particularly a high-voltage battery (HV battery), which delivers a DC voltage of 400V or 800V. This DC voltage is applied between a positive pole and a negative pole of the DC input. The inverter comprises a link capacitor, which comprises a plurality of input contacts for the injection of a DC current which is generated by means of the DC voltage source. The input contacts are fitted to a capacitor housing of the link capacitor. The input contacts comprise both positive and negative input contacts. The positive input contacts are connected to the positive pole of the DC input, and thus to a positive electrode of the DC voltage source. The negative input contacts are connected to the negative pole of the DC input, and thus to a negative electrode of the DC voltage source.

The inverter further comprises a plurality of half-bridges, each of which comprises a plurality of semiconductor switching elements for converting the DC current into an AC current having a plurality of phase currents. Each half-bridge is assigned to one phase or one phase current of the AC current. The half-bridges extend in a longitudinal direction from the DC input to the AC output. As the same time, individual half-bridges are arranged in a row along a transverse direction, which is oriented perpendicularly to the longitudinal direction.

Each half-bridge can preferably comprise a single half-bridge module or a plurality of half-bridge modules. Within the meaning of the present disclosure, the half-bridge module is a bridge circuit of modular design, which comprises a module high-side and a module low-side. The module high-side and the module low-side respectively comprise one or more parallel-connected semiconductor switching elements. In the event that a half-bridge comprises a plurality of half-bridge modules, the module high-sides of these half-bridge modules are mutually connected in parallel, and form a common high-side of the entire half-bridge, wherein the module low-sides of these half-bridge modules are likewise mutually connected in parallel, and form a common low-side of the entire half-bridge. This means that, depending upon the vehicle power required, the respective quantity of current which can be carried by the half-bridges can be arbitrarily scaled up or down, by an appropriate selection of the number of half-bridge modules.

The inverter further comprises a DC conductor rail assembly for the infeed of DC current to the half-bridges. The DC conductor rail assembly comprises a positive DC conductor rail and a negative DC conductor rail. DC current flows from the input contacts of the link capacitor, via the latter, to the positive and negative DC conductor rails. From here, DC current is infed to the respective half-bridges, and preferably into the individual half-bridge modules.

By the switching of semiconductor switching elements in the half-bridges, the phase currents, and thus the overall AC voltage is generated on the basis of the DC current infeed. An AC conductor rail assembly is arranged in the inverter, for the output of AC current to the electric axle drive. To this end, the AC conductor rail assembly comprises a plurality of AC conductor rails, each of which comprises a plurality of input contacts and an output contact. The input contacts are connected to AC power terminals of the half-bridges, wherein the output contact is connected to the electrical machine of the electric axle drive, particularly to the winding thereof. The output contacts of the plurality of phases form part of the AC output of the inverter.

The inverter further comprises a cooler for cooling the half-bridges. During the operation of the inverter, high currents and power losses generate a large quantity of heat, the evacuation of which is required. The cooler is preferably bonded, at its underside, to the half-bridges, particularly to a metal layer of a substrate of the respective half-bridge modules.

According to the present disclosure, the positive and/or negative DC conductor rail extends over the row of half-bridges. This means that the width of the positive and/or negative DC conductor rail extends to the width of the half-bridges. This enlarges the surface area of the DC conductor rails, such that the current density of the DC current which is to be carried by the DC conductor rails is reduced. This reduces the heat which is generated by current in the half-bridges. Moreover, a symmetrical current flux with respect to the longitudinal direction is thus permitted, the stray inductance of the inverter is reduced and the electromagnetic compatibility (EMC) of the inverter is improved. Moreover, the large-area DC conductor rails permit the inverter to assume a planar design, thus resulting in an inverter of more compact structural form.

According to one embodiment, the positive DC conductor rail and the negative DC conductor rail, on the output side, comprise a plurality of conductor rail branches for connection to a DC power input of the half-bridge modules, wherein each conductor rail branch is assigned to one of the half-bridge modules. Consequently, in an exemplary half-bridge comprised of two half-bridge modules, two conductor rail branches are assigned to this half-bridge such that, in the case of a three-phase AC current, the inverter comprises a total of six conductor rail branches. This arrangement facilitates distributed contact-connection between the DC conductor rail assembly and the half-bridges. In general, depending upon the current class, the inverter can also comprise more or fewer half-bridge modules or conductor rail branches.

According to a further embodiment, the positive DC conductor rail and/or the negative DC conductor rail, on the outer side thereof, are embedded in a current-insulating encapsulation material. Encapsulation of the DC conductor rail assembly improves mechanical stability, and also increases clearances and creepage distances between the positive and negative DC conductor rails, thus ensuring secure galvanic isolation between the latter.

According to a further embodiment, the encapsulation of the positive DC conductor rail and/or of the negative DC conductor rail comprises a plurality of fastening points for the respective accommodation of fasteners for the attachment of the encapsulation to an inverter housing, wherein the number of fastening points can correspond to the number of half-bridges, and wherein a relative position between the fastening point and the associated half-bridge is identical for all half-bridges. The fastening points are configured, for example, in the form of openings, particularly in the form of feed-through openings, which preferably extend through the encapsulation, the positive and the negative DC conductor rails. The fasteners are preferably metallic fasteners, such as screws. As the relative position of the fastening point to the associated half-bridge is identical for all the half-bridges, a particularly uniform current distribution for all (three) phases is achieved. This improves the symmetry of the current flux with respect to the longitudinal direction, thus further optimizing the functionality of the inverter vis-à-vis EMC.

According to a further embodiment, the encapsulation of the positive DC conductor rail and/or of the negative DC conductor rail comprises a plurality of openings for the feedthrough of signal terminals of the half-bridges. This arrangement facilitates the contact-connection of signal terminals on a circuit board of the inverter, which is fitted to the upper side of the encapsulation. Alternatively, the signal terminals can be positioned above the carrier frame.

According to a further embodiment, all the signal terminals of the half-bridges are bonded to the circuit board by means of soldering. In this manner, during assembly, all signal terminals can be bonded to the circuit board by the same bonding method, namely soldering. Any additional connection steps associated with the employment of a plurality of different bonding methods are thus rendered superfluous, thereby reducing the complexity of assembly of the inverter. Alternatively, press-fit pins can be employed as signal terminals.

According to a further embodiment, a carrier frame for the accommodation of the half-bridge modules is arranged between an inverter housing and a circuit board, wherein a plurality of signal terminals of the half-bridges are vertically fed through the carrier frame in the direction of a circuit board. The carrier frame enhances the mechanical stability of the signal terminals, and protects the latter against breakage during bonding to the circuit board. At the same time, the carrier frame assumes a function for the positioning of signal terminals. The carrier frame moreover permits a form-fitted or interference-fitted connection between various components within the inverter, thereby enhancing the robustness of the inverter. The carrier frame is further employed for the maintenance of clearances and creepage distances.

According to a further embodiment, a temperature sensor is arranged between a circuit board and the cooler, such that the temperature sensor is secured, at its underside, to the cooler or the half-bridge modules by means of a thermally conductive layer, wherein at least one signal line of the temperature sensor extends through the carrier frame to the circuit board. Thus, firstly, the temperature sensor is more effectively thermally coupled to the cooler. Secondly, the carrier frame stabilizes the position of the temperature sensor and enhances the reliability of temperature measurement.

According to a further embodiment, a current-insulating heat-conducting foil is arranged between an inverter housing and the DC input, the DC conductor rail assembly and/or the AC conductor rail assembly. The heat-conducting foil improves thermal coupling between the inverter housing, on the one hand, and the DC input, the DC conductor rail assembly and/or the AC conductor rail assembly on the other. The more effective evacuation of heat from current-carrying components of the inverter is achieved accordingly. The heat-conducting foil also serves for the maintenance of clearances and creepage distances, and thus for the maintenance of galvanic isolation between energized components of the inverter.

The present disclosure further relates to an electric axle drive having such an inverter, and to a vehicle having such an electric axle drive. The above-mentioned advantages described with respect to the inverter according to the present disclosure also apply to the axle drive according to the present disclosure and to the vehicle according to the present disclosure.

The present disclosure is described hereinafter with reference to the exemplary embodiments represented in the figures.

DETAILED DESCRIPTION

Identical objects, functional units and comparable components are identified in all the figures by the same reference symbols. These objects, functional units and comparable components are configured identically with respect to their technical features, unless explicitly or implicitly indicated otherwise in the description.

Figure 1:
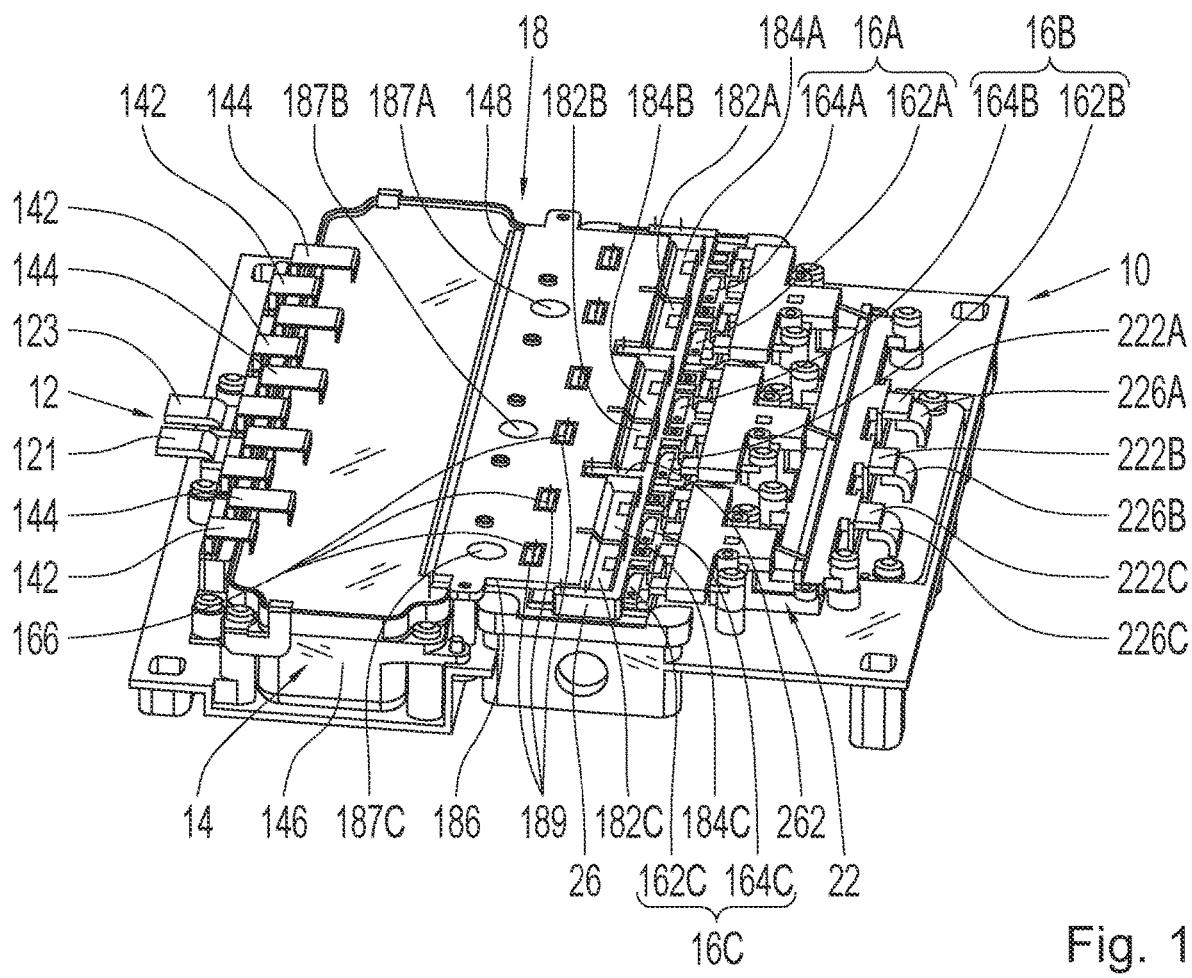
FIG. 1 shows a schematic representation of an inverter, in a perspective view.

FIG. 1 shows a schematic representation of an inverter 10 for energizing an electric axle drive of an electric vehicle or a hybrid vehicle. The inverter 10 comprises a DC input 12, a link capacitor 14, a plurality of half-bridges 16A-C, a DC conductor rail assembly, an AC output 22, a cooler 24, a circuit board 28 and an inverter housing 30. The inverter 10 additionally comprises further components, which are described in detail hereinafter.

Figure 2:
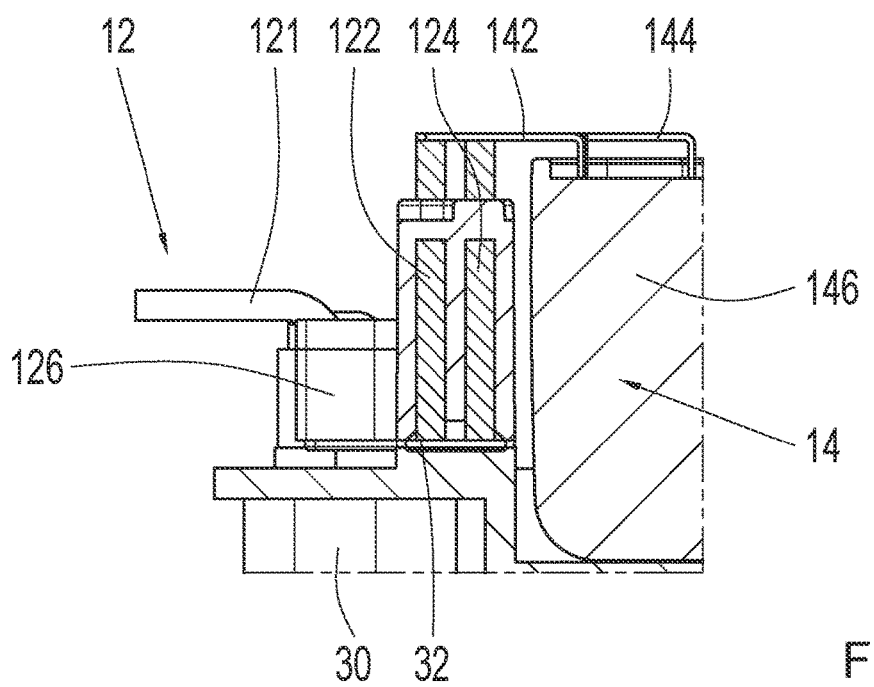
FIG. 2 shows a schematic representation of a DC input of the inverter according to FIG. 1, in a lateral sectional view.

Here, and in FIG. 2, the DC input 12 is shown in greater detail in a lateral sectional view. The DC input 12 comprises a positive input terminal 121 and a negative input terminal 123, wherein the input terminals 121, 123 are configured for connection to a DC voltage source, preferably a battery, particularly a high-voltage (HV) battery. The DC input 12 further comprises a plurality of positive input contacts 122 and a plurality of negative input contacts 124. In this case, the positive input contacts 122 are configured in the form of output-side current contacts of the positive input terminal 121, wherein the negative input contacts 124 are configured in the form of output-side current contacts of the negative input terminal 123. For the purposes of galvanic isolation between the positive input contacts 122 and the negative input contacts 124, the input contacts 122, 124 are embedded in an electrically insulating encapsulation material. The encapsulation 126 simultaneously functions as a carrier for the input contacts 122, 124, and is applied to the underside of the inverter housing 30 by means of a current-insulating heat-conducting foil 32.

The link capacitor 14 comprises a capacitor housing 146, on the first edge of which, facing the DC input 12, a plurality of positive and negative capacitor input contacts 142, 144 are arranged. The positive capacitor input contacts 142 are electrically connected to the positive input contacts 122, wherein the negative capacitor input contacts 144 are electrically connected to the negative input contacts 124. The input contacts 122, 124 and the capacitor input contacts 142, 144 are arranged on the capacitor housing 146 such that the positive capacitor input contacts 142 and the negative capacitor input contacts 144 are arranged side by side in an alternating arrangement, as shown in FIG. 1. The capacitor housing 146 is configured as a box-shaped structure, and extends in a longitudinal direction between the DC input and the AC output, and in a transverse direction thereto.

Figure 3:
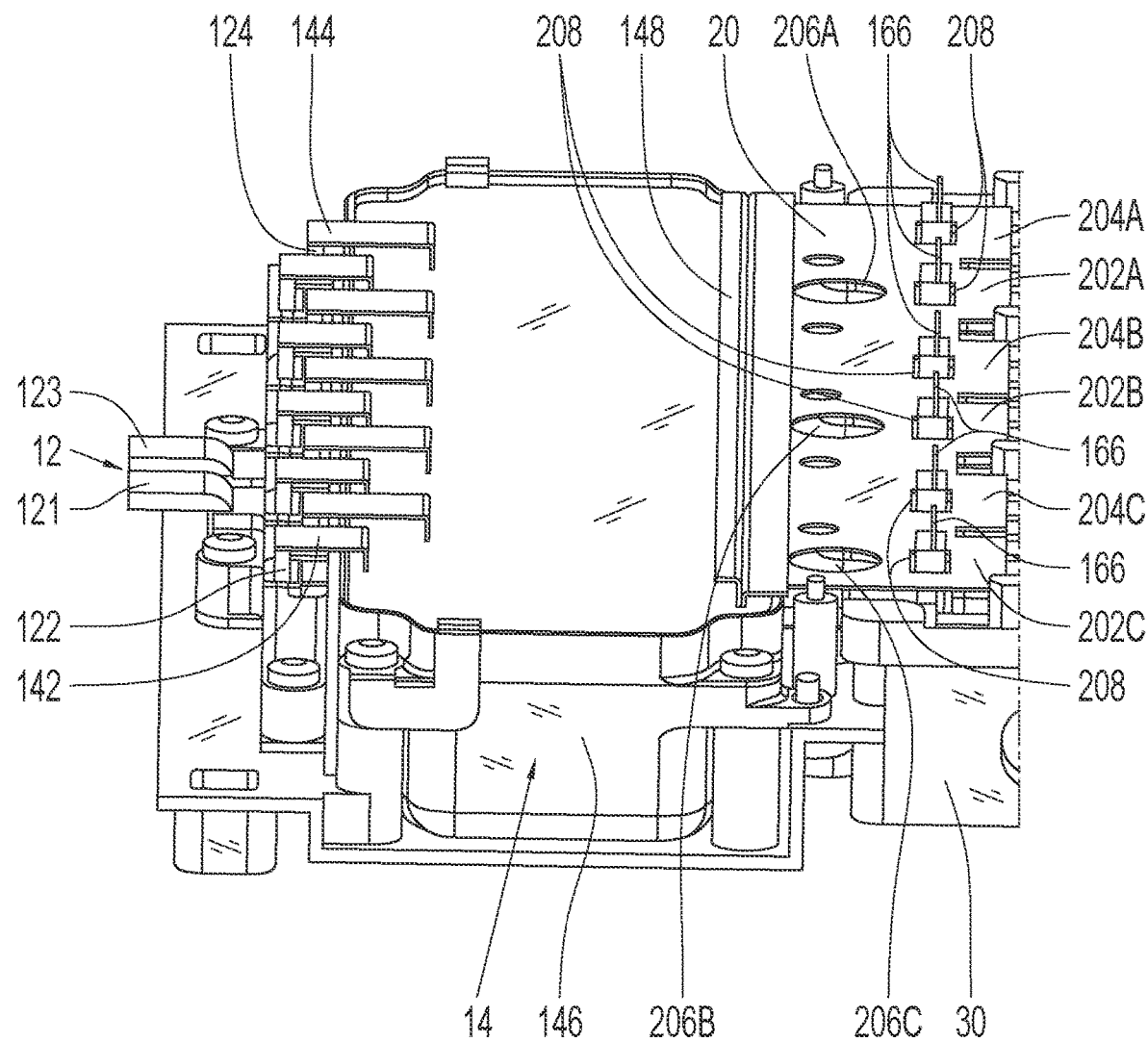
FIG. 3 shows a schematic representation of a link capacitor and a DC conductor rail assembly of the inverter according to FIG. 1, in a perspective view.

The DC conductor rail assembly is fitted to a second edge, facing the capacitor input contacts 142, 144. The DC conductor rail assembly connects the link capacitor 14 to the half-bridges 16A-C. To this end, the DC conductor rail assembly comprises a positive DC conductor rail 18 and a negative DC conductor rail 20, which extends over the width of the capacitor housing 146. The link capacitor 14, on its output side, comprises a transverse contact 148 (see FIGS. 1, 3 and 6), to which the positive DC conductor rail 18 is electrically connected, as represented in the side view in FIG. 6. The negative DC conductor rail 20, conversely, is integrated in the link capacitor 14, and preferably extends, as represented schematically in FIG. 6, from the power electronics 16 into the link capacitor 14. The DC conductor rails 18, 20, on the output side, comprise a plurality of positive or negative conductor rail branches 182A-C, 184A-C, 202A-C, 204A-C, each of which is connected to a half-bridge module 162A-C, 164A-C of the half-bridges 16A-C. The half-bridge modules 162A-C, 164A-C respectively comprise a module high-side and a module low-side, wherein the module high-side and the module low-side respectively comprise one or more parallel-connected semiconductor switching elements. In each half-bridge 16A-C, the module high-sides of the half-bridge modules 162A-C, 164A-C are mutually connected in parallel to form a high-side of the half-bridge 16A-C. In each half-bridge 16A-C, the module low-sides of the half-bridge modules 162A-C, 164A-C are mutually connected in parallel to form a low-side of the half-bridge 16A-C. In the example represented here, each half-bridge 16A-C comprises a first half-bridge module 162A-C and a second half-bridge module 164A-C. Each half-bridge module 162A-C, 164A-C comprises a positive DC power terminal and a negative DC power terminal. A positive conductor rail branch 182A-C, 184A-C is electrically contact-connected to the positive DC power terminal. A negative conductor rail branch 202A-C, 204A-C is electrically contact-connected to the negative DC power terminal. Electrical contact-connection, as schematically represented in FIG. 6, is executed on the upper side of the respective half-bridge modules 162A-C, 164A-C which, is comparison with conventional contact-connection arrangements, is simpler and permits a compact structure of the inverter 10.

Figure 4:
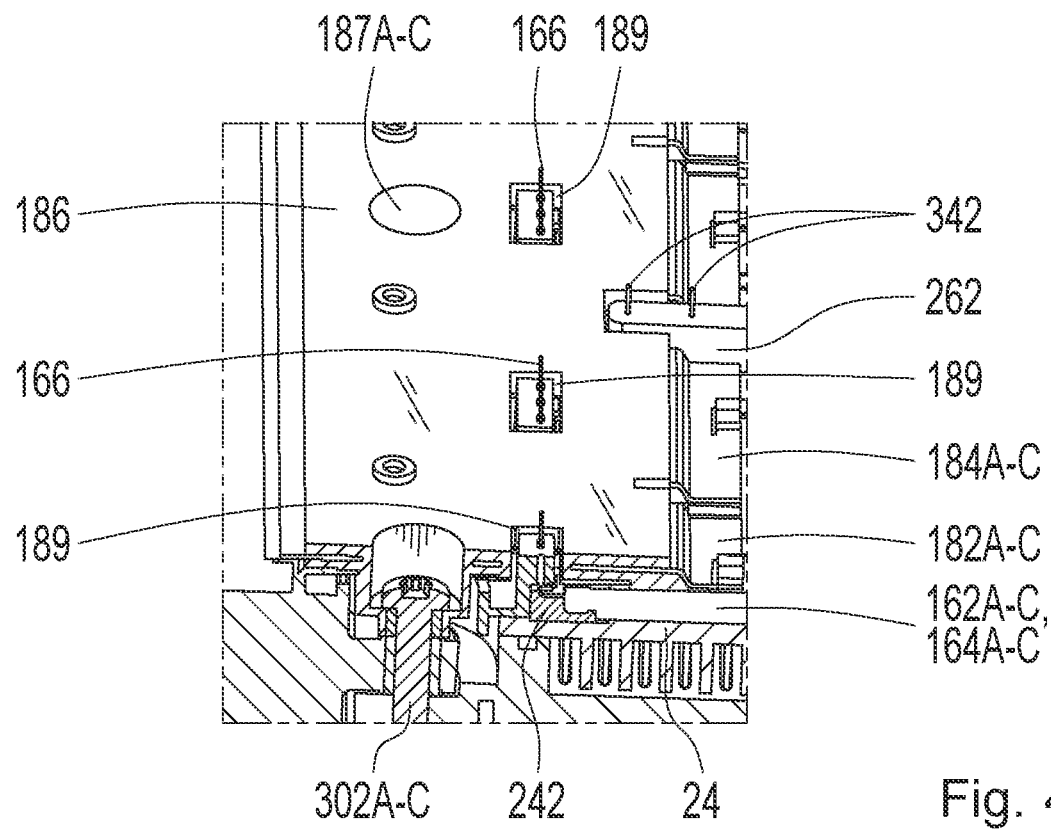
FIGS. 4-5 show a further schematic representation of the DC conductor rail assembly of the inverter according to FIG. 1, in a perspective view.
Figure 5:
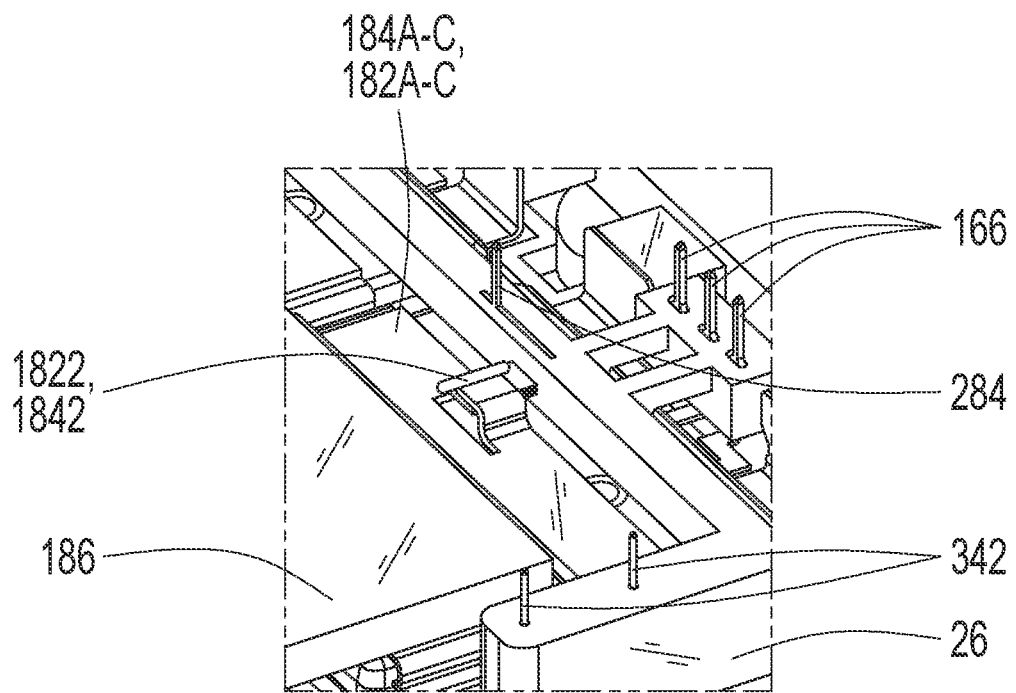

The DC conductor rail assembly can likewise be embedded in an electrically insulating encapsulation material. In the example represented here, encapsulation 186 is applied to both sides of the positive DC conductor rail 18, i.e. to the upper side and the underside. Between the encapsulation 186 of the positive DC conductor rail 18 and the negative DC conductor rail 20, an insulating foil is provided, which preferably extends only partially over the negative DC conductor rail 18. In the region between the transverse contact 148 and the conductor rail branches 182A-C, 184A-C, 202A-C, 204A-C, the DC conductor rails 18, 20 respectively comprise a full-width intermediate section, in which a plurality of fastening points 187A-C, 206A-C are configured for the accommodation of a plurality of fasteners 302A-C (see FIG. 4), for the purposes of the attachment of the DC conductor rail assembly to the inverter housing 30. The fastening points 187A-C, 206A-C are preferably configured in the form of screw holes, wherein the fasteners 302A-C are preferably screws which, from the upper side of the DC conductor rail assembly, extend through the positive DC conductor rail 18, the negative DC conductor rail 20 and the encapsulation 186 to the inverter housing 30. This permits a particularly stable fastening of the DC conductor rail assembly. Additionally, a plurality of openings 189, 208 are configured in the intermediate section of the positive and negative DC conductor rails 18, 20, through which a plurality of signal terminals 166 of the half-bridges 16A-C are fed in an upward direction. The signal terminals 166 extend through to the circuit board 28, in order to permit the transmission of control signals between the latter and the half-bridges 16A-C, particularly the control terminals (gate electrodes) of the semiconductor switching elements.

Figure 6:
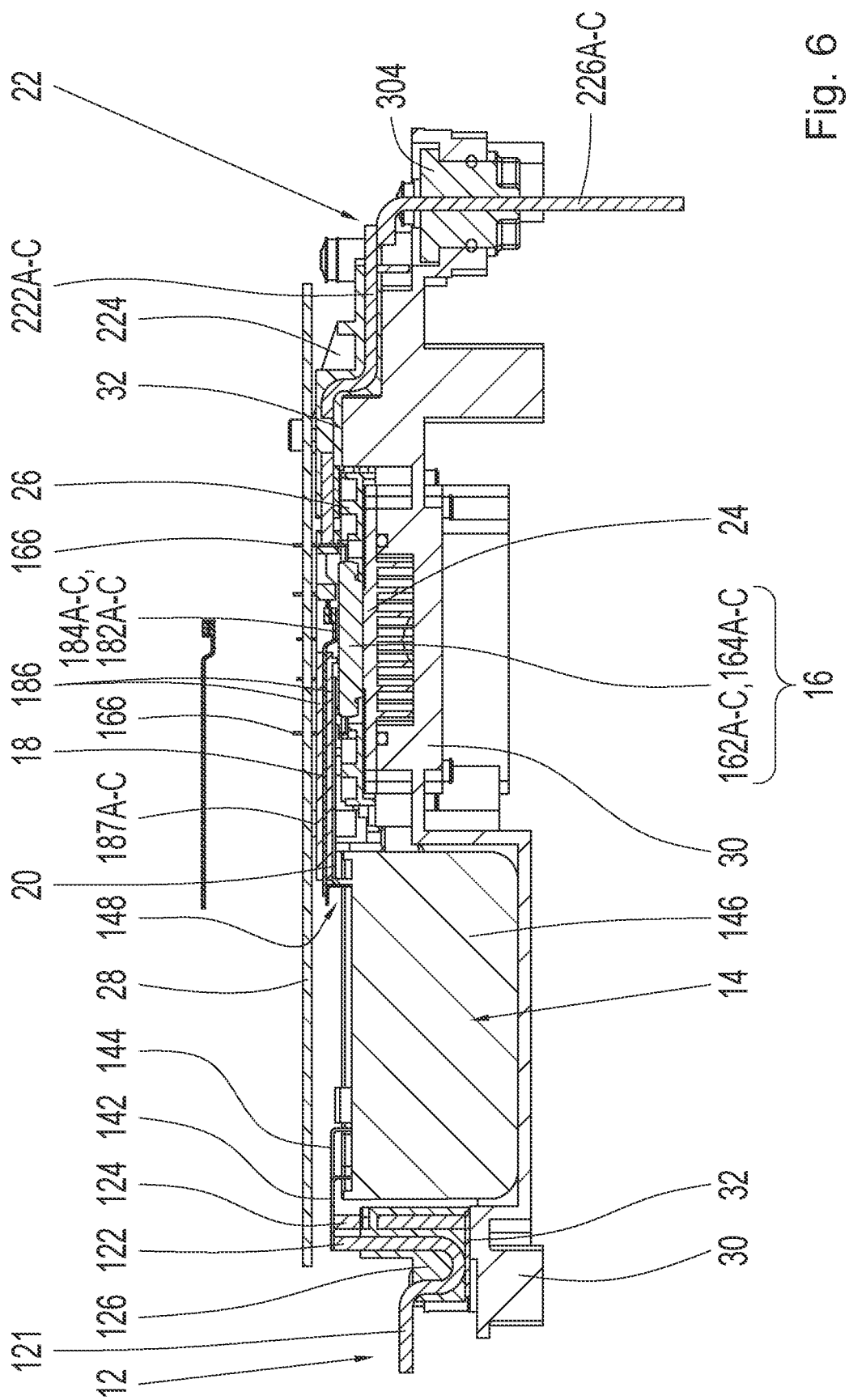
FIG. 6 shows a further schematic representation of the inverter according to FIG. 1, in a side view.

A carrier frame 26, as represented in FIGS. 1 and 6, is arranged between the half-bridges 16A-C on one side and the inverter housing 30 on the other. The signal terminals 166 extend upwards from the semiconductor switching elements through a plurality of tower-shaped signal guideways in the carrier frame 26 and through the openings 189, 208 in the DC conductor rails 18, 20, and are then accommodated in the circuit board 28 (see FIG. 6). On the underside, the carrier frame 26 is firstly braced on the cooler 24, and secondly on the inverter housing 30. The cooler 24, as represented here for exemplary purposes, can comprise a cooling structure for a directly cooled fluid cooling arrangement having a plurality of fins (pin-fin structure), which extend downwards from a cooling plate. This cooling structure can be geometrically designed with reference to various marginal conditions, such that an optimum ratio is established between the fluid energy employed and the thermal evacuation capacity. This enlarges the cooling surface area and increases the cooling capacity.

The half-bridge modules 162A-C, 164A-C are externally provided with an encapsulation of an electrically-insulating encapsulating material, in order to protect the semiconductor switching elements against environmental influences. Only the power terminals (not represented), the signal terminals 166 and an under-surface adjoining the cooling body 24 are not covered by the encapsulating material. The half-bridge modules 162A-C, 164A-C are respectively bonded to the cooling plate by sintering or soldering. The carrier frame 26 is employed for guiding the signal terminals 166, for the accommodation of a temperature sensor 34 (described in greater detail below) and for the maintenance of clearances and creepage distances. An insulating foil 242 is arranged between the half-bridge modules 182A-C, 184A-C and the cooler 24, in order to maintain clearances and creepage distances between the power terminals of the half-bridge modules 162AC, 164A-C on the one hand, and the cooling plate on the other.

The AC output 22 (or the AC conductor rail assembly) comprises a plurality of AC conductor rails 222A-C, a plurality of AC output contacts 226A-C which are connected to the AC conductor rails 222A-C, and an encapsulation 224, which is formed by the moulding of electrically-insulating encapsulating material onto the AC conductor rails 222A-C. In the present example, the encapsulation 224 is executed on the upper side of the AC conductor rails 222A-C. On the underside of the AC conductor rails 222A-C, a current-insulating heat-conducting foil 32 is arranged, in the interests of improved thermal coupling with the inverter housing 30. On the underside, the AC conductor rails 222A-C are partially encapsulated in the current-insulating heat-conducting foil 32, and partially in the electrically-insulating material. This arrangement ensures localized thermal coupling, which is restricted to a region in which the cooling of the AC conductor rails 222A-C from the underside is required. The unnecessary employment of cost-intensive heat-conducting foil 32 is avoided as a result. Each of the AC conductor rails 222A-C extends horizontally between an AC power terminal of the half-bridge modules 162A-C, 164A-C and one of the AC output contacts 226A-C. The half-bridge modules 162A-C, 164A-C respectively comprise a plurality (in the present example, two) AC power terminals, each of which is electrically connected to one of the AC power rails 222A-C. The AC output contacts 226A-C are vertically oriented, and project beyond an end section 304 of the inverter housing 30, in order to connect to windings of an electrical machine of the electric axle drive.

Figure 7:
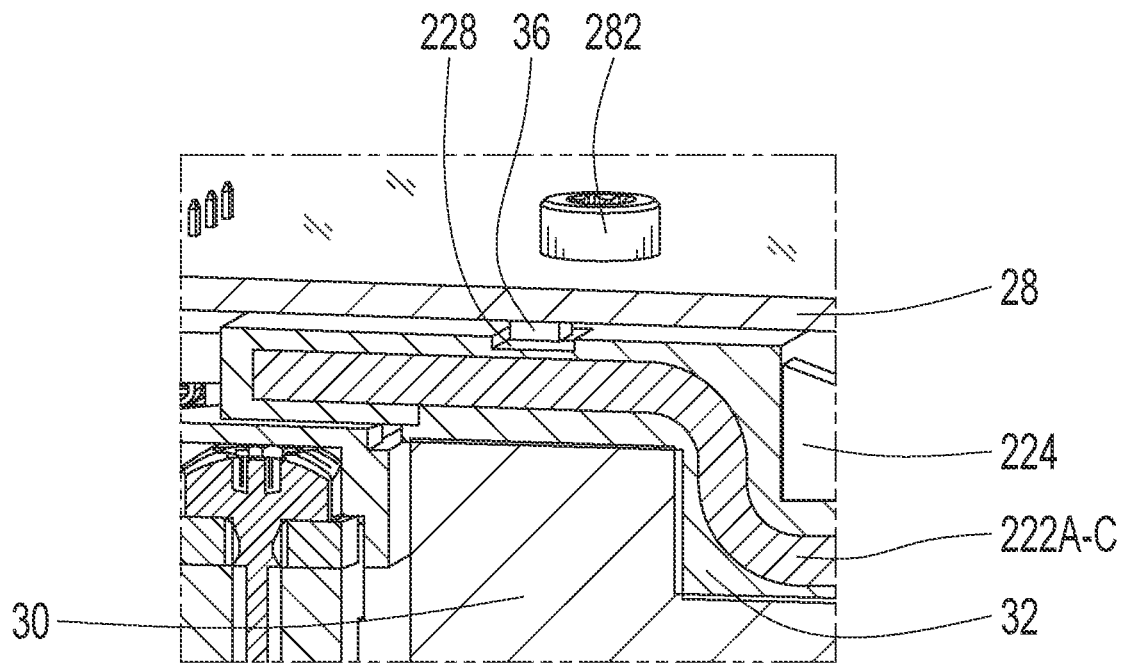
FIG. 7 shows a schematic representation of an AC conductor rail assembly of the inverter according to FIG. 1, in a side view.

As represented in FIG. 7, a current sensor 36 is electrically bonded to the circuit board 28 at the underside thereof, preferably by soldering. Below the current sensor 36, a cut-out 228 is configured in the encapsulation 224 of the AC conductor rails 222A-C. The cut-out 228 reduces the clearance between the current sensor 36 and the AC conductor rails 222A-C. At the same time, a base layer of the cut-out 228 assumes the function of galvanic isolation between the current sensor 36 and the AC conductor rails 222A-C. The current sensor 36 is employed for the detection of the respective AC phase currents. The temperature sensor 36 typically comprises a plurality of signal lines (not represented here), which are electrically bonded or soldered to the circuit board 28, in order to transmit current strengths thus detected to an internal or external processing unit, for example an ECU of the vehicle (not represented here).

Figure 8:
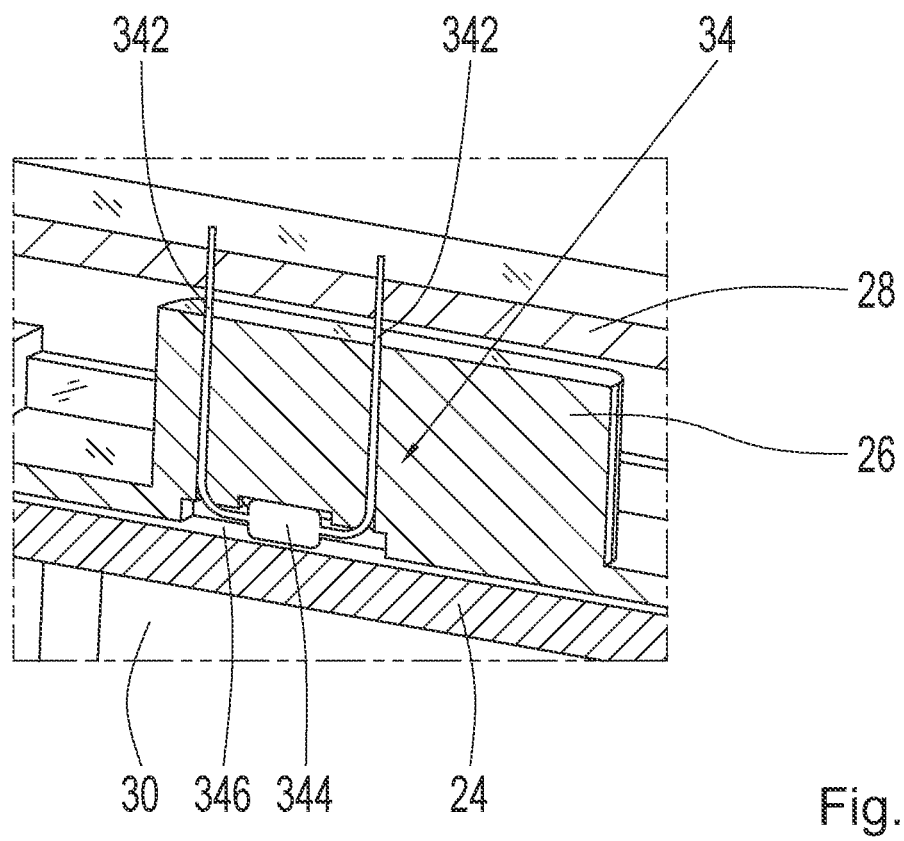
FIG. 8 shows a schematic representation of a temperature sensor fitted to the AC conductor rail assembly, in a perspective view.

A temperature sensor 34, as represented in FIG. 8, is arranged in an interspace between the carrier frame 26 and the cooler 24. The temperature sensor 34 comprises a sensor body 344 and two signal lines 342, which extend from both ends of the sensor body 344, initially horizontally, and thereafter vertically upwards. The signal lines 342 are fed through the carrier frame 26 and the circuit board 28. A heat-conducting layer 346 is applied between the sensor body 344 and the cooler 24.

REFERENCE SYMBOLS

10 Inverter
12 DC input
121 Negative input terminal
122 Negative input contact
123 Positive input terminal
124 Positive input contact
126 Encapsulation
14 Link capacitor
142 Positive capacitor input contact
144 Negative capacitor input contact
146 Capacitor housing
148 Capacitor output
16A-C Half-bridges
162A-C, 164A-C Half-bridge modules
166 Signal terminals
18 Positive DC conductor rail
182A-C, 184A-C Positive conductor rail branches
1822, 1842 Laser weld
186 Encapsulation
187A-C Fastening points
188 Transverse contact
189 Openings
20 Negative DC conductor rail
202A-C, 204A-C Negative conductor rail branches
206A-C Fastening points
208 Openings
22 A C output
222A-C AC conductor rails
224 Encapsulation
226A-C Output terminals
228 Cut-out
24 Cooler
242 Insulating foil
26 Carrier frame
262 Barrier
28 Circuit board
282 Screw
284 Contact-connection
30 Inverter housing 302A-C Fasteners
304 End section
32 Heat-conducting foil
34 Temperature sensor
342 Signal line
344 Sensor body
346 Heat-conducting layer
36 Current sensor

The invention claimed is:

1. An inverter for operating an electric drive in an electric vehicle and/or a hybrid vehicle, the inverter comprising:
a DC input configured to connect to a DC voltage source;
a link capacitor comprising a plurality of input contacts configured for injection of a DC current which is generated by the DC voltage source, wherein the input contacts are fitted to a capacitor housing of the link capacitor;
a plurality of half-bridges, each of which comprises a plurality of semiconductor switching elements for converting the DC current into an AC current having a plurality of phase currents, wherein the plurality of half-bridges are arranged in a row along a transverse direction to the inverter;
a DC conductor rail assembly configured to infeed the DC current to the half-bridges, and which comprises a positive DC conductor rail and a negative DC conductor rail, wherein the positive DC conductor rail and/or the negative DC conductor rail extends in a transverse direction to the inverter over the row of half-bridges, such that a width of the positive DC conductor rail and/or the negative DC conductor rail extends to a width of the row of half-bridges;
an AC conductor rail assembly configured to output the AC current to the electric drive; and
a cooler configured to cool the plurality of half-bridges.

2. The inverter according to claim 1,
wherein the plurality of half-bridges respectively comprise a plurality of half-bridge modules, each having a module high-side and a module low-side,
wherein the module high-side and the module low-side respectively comprise one or more parallel-connected semiconductor switching elements,
wherein, in each half-bridge, the module high-sides of the half-bridge modules are mutually connected in parallel to form a high-side of the half-bridge, and wherein, in each half-bridge, the module low-sides of the half-bridge modules are mutually connected in parallel to form a low-side of the half-bridge.

3. The inverter according to claim 2,
wherein an output sides of the positive DC conductor rail and the negative DC conductor rail comprise a plurality of conductor rail branches each connected to a DC power input of the half-bridge modules, wherein each conductor rail branch is assigned to one of the half-bridge modules.

4. The inverter according to claim 2, wherein an output side of the positive DC conductor rail and/or the negative DC conductor rail is embedded in a current-insulating encapsulation material.

5. The inverter according to claim 4,
wherein the encapsulation material comprises a plurality of fastening points for respective accommodation of fasteners configured to attach the encapsulation material to an inverter housing, wherein a relative position between a respective fastening point and an associated half-bridge is identical for all of the half-bridges.

6. The inverter according to claim 5, wherein the encapsulation material comprises a plurality of openings configured to feedthrough signal terminals of the half-bridges.

7. The inverter according to claim 1, comprising signal terminals of the plurality of half-bridges, wherein the signal terminals are bonded to a circuit board by soldering, or are configured in the form of press-fit pins.

8. The inverter according to claim 1, comprising a carrier frame arranged between an inverter housing and a circuit board, wherein a plurality of signal terminals of the half-bridges are vertically fed through the carrier frame in the direction of the circuit board.

9. The inverter according to claim 8, comprising a temperature sensor arranged between the circuit board and the cooler such that the temperature sensor is secured, at its underside, to the cooler by a thermally conductive layer, wherein at least one signal line of the temperature sensor extends through the carrier frame to the circuit board.

10. The inverter according to claim 1, comprising an insulating foil arranged between an inverter housing and the DC input, the DC conductor rail assembly, and/or the AC conductor rail assembly.

11. An electric axle drive for an electric vehicle or a hybrid vehicle, comprising an electrical machine, a drive mechanism, and the inverter according to claim 1.

12. An electric vehicle or a hybrid vehicle, comprising the electric axle drive according to claim 11.

* * * * *